US009269755B2

(12) United States Patent
Kim

(10) Patent No.: US 9,269,755 B2
(45) Date of Patent: Feb. 23, 2016

(54) ORGANIC LIGHT-EMITTING DISPLAY APPARATUS AND PHOTO MASK FOR MANUFACTURING SAME

(71) Applicant: SAMSUNG DISPLAY CO., LTD., Yongin, Gyeonggi-Do (KR)

(72) Inventor: Tae-Joon Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/957,348

(22) Filed: Aug. 1, 2013

(65) Prior Publication Data

US 2014/0332761 A1    Nov. 13, 2014

(30) Foreign Application Priority Data

May 10, 2013    (KR) .................... 10-2013-0053393

(51) Int. Cl.
| | |
|---|---|
| *H01L 29/08* | (2006.01) |
| *H01L 35/24* | (2006.01) |
| *H01L 51/00* | (2006.01) |
| *H01L 27/32* | (2006.01) |
| *G06F 1/00* | (2006.01) |
| *G09G 3/32* | (2006.01) |
| *H01L 27/12* | (2006.01) |

(52) U.S. Cl.
CPC .............. *H01L 27/3262* (2013.01); *G06F 1/00* (2013.01); *G09G 3/3233* (2013.01); *H01L 27/1222* (2013.01)

(58) Field of Classification Search
CPC ...... G09G 3/00; G09G 2300/00; H01L 27/00; H01L 33/00; H01L 51/00
USPC ................... 257/40, 71, 88; 345/82, 204
See application file for complete search history.

(56) References Cited

U.S. PATENT DOCUMENTS

| | | | |
|---|---|---|---|
| 6,403,477 | B1 | 6/2002 | Tounai |
| 2002/0104995 | A1* | 8/2002 | Yamazaki et al. ............... 257/72 |
| 2008/0017866 | A1* | 1/2008 | Sato ............................... 257/72 |
| 2008/0129664 | A1* | 6/2008 | Lin et al. ......................... 345/87 |
| 2012/0058420 | A1 | 3/2012 | Nam et al. |
| 2013/0257839 | A1* | 10/2013 | Hyeon et al. .................. 345/212 |
| 2013/0328853 | A1* | 12/2013 | Hong ............................. 345/212 |
| 2014/0002427 | A1* | 1/2014 | Yeo et al. ....................... 345/204 |

(Continued)

FOREIGN PATENT DOCUMENTS

| | | |
|---|---|---|
| JP | 09-034101 | 2/1997 |
| KR | 1999-0037982 | 6/1999 |

(Continued)

*Primary Examiner* — Telly Green
(74) *Attorney, Agent, or Firm* — Christie, Parker & Hale, LLP

(57) ABSTRACT

An organic light-emitting display apparatus including a switching thin film transistor (TFT) on a substrate, wherein the switching TFT is electrically coupled to a scan line and a data line, a driving TFT electrically coupled to the switching TFT, the driving TFT including a driving semiconductor layer, and an organic light-emitting diode (OLED) electrically coupled to the driving TFT, wherein the driving semiconductor layer includes a first region bending from a first direction to a second direction that intersects with the first direction a second region bending from the second direction to the first direction, and a third region coupling the first region to the second region, the third region making an obtuse angle with each of the first region and the second region.

11 Claims, 7 Drawing Sheets

(56) References Cited

U.S. PATENT DOCUMENTS

| | | | |
|---|---|---|---|
| 2014/0027728 A1* | 1/2014 | Yoon et al. | 257/40 |
| 2014/0034923 A1* | 2/2014 | Kim et al. | 257/40 |
| 2014/0070184 A1* | 3/2014 | Shin | 257/40 |
| 2014/0097439 A1* | 4/2014 | Jeon | 257/71 |
| 2014/0097440 A1* | 4/2014 | Jeon | 257/72 |
| 2014/0098078 A1* | 4/2014 | Jeon et al. | 345/205 |
| 2014/0118319 A1* | 5/2014 | Jeon | 345/207 |
| 2014/0124751 A1* | 5/2014 | Choi et al. | 257/40 |
| 2014/0124754 A1* | 5/2014 | Park et al. | 257/40 |

FOREIGN PATENT DOCUMENTS

| | | |
|---|---|---|
| KR | 10-0211766 | 8/1999 |
| KR | 2001-0051225 | 6/2001 |
| KR | 10-2006-0011663 | 2/2006 |
| KR | 10-2012-0023467 | 3/2012 |

* cited by examiner

ORGANIC LIGHT-EMITTING DISPLAY APPARATUS AND PHOTO MASK FOR MANUFACTURING SAME

CROSS-REFERENCE TO RELATED APPLICATION

This application claims priority to and the benefit of Korean Patent Application No. 10-2013-0053393, filed on May 10, 2013, in the Korean Intellectual Property Office, the disclosure of which is incorporated herein in its entirety by reference.

BACKGROUND

1. Field

The embodiments of the present invention relate to an organic light-emitting display apparatus and a photo mask for manufacturing the same.

2. Description of the Related Art

An organic light-emitting display apparatus includes two electrodes and an organic emission layer therebetween. Electrons from one electrode and holes from the other electrode are combined in the organic emission layer to form excitons, which emits light as they drop to a lower energy level.

Such an organic light-emitting display apparatus includes a plurality of pixels. Each pixel includes an organic light-emitting diode (OLED) that is a self-lighting device, a plurality of thin film transistors (TFTs) that include a switching TFT and a driving TFT, and a capacitor that is used for driving the OLED.

It is desired for the gate voltages of the driving TFT to have a wide driving range so as to allow adequate regulation of the amplitude of gate voltages Vgs of the driving TFTs to enable abundant gradations of displayed color intensity. To this end, a design to increase (e.g., maximize) a channel length of a driving semiconductor layer is desired. When a driving TFT is designed such that the driving semiconductor layer has a long channel length in a limited space, it is difficult for the driving semiconductor layer to have a constant channel width. When the channel width of the driving semiconductor layer is not constant, limitation problem may arise in that the effective channel length may be shorter than a predicted length (e.g., an expected length) due to carriers that move along the shortest distance.

SUMMARY

Aspects of embodiments according to the present invention are directed toward an organic light-emitting display apparatus including a driving semiconductor layer with a substantially constant (e.g., constant) channel width and a photo mask for manufacturing the organic light-emitting display apparatus.

According to an aspect of an embodiment according to the present invention, there is provided an organic light-emitting display apparatus including: a switching thin film transistor (TFT) on a substrate, wherein the switching TFT is electrically coupled to a scan line and a data line; a driving TFT electrically coupled to the switching TFT, the driving TFT including a driving semiconductor layer; and an organic light-emitting diode (OLED) electrically coupled to the driving TFT, wherein the driving semiconductor layer includes: a first region bending from a first direction to a second direction that intersects with the first direction; a second region bending from the second direction to the first direction; and a third region coupling the first region to the second region, the third region making an obtuse angle with each of the first region and the second region.

Each of the first region and the second region may include: a fourth region extending in the first direction; a fifth region extending in the second direction; and a sixth region coupling the fourth region to the fifth region, the sixth region having a curvature.

The sixth region may include an outer corner and an inner corner that faces the outer corner, and wherein a radius of curvature of the outer corner is greater than a radius of curvature of the inner corner.

The driving semiconductor layer may have a constant width from the first region to the third region.

A length of the first region or a length of the second region may be longer than a length of the third region.

The third region may include a linear portion.

The third region may include a plurality of curved portions.

The organic light-emitting display apparatus may further include: a first dielectric layer on the substrate to cover the driving semiconductor layer; and a capacitor on the first dielectric layer, wherein the capacitor vertically faces the driving semiconductor layer.

The capacitor may further include: a first capacitor electrode on the first dielectric layer, wherein the first capacitor electrode vertically faces the driving semiconductor layer; a second dielectric layer covering the first capacitor electrode; and a second capacitor electrode on the second dielectric layer, wherein the second capacitor electrode vertically faces the first capacitor electrode.

The organic light-emitting display apparatus may further include a compensation TFT configured to compensate a threshold voltage of the driving TFT, wherein the compensation TFT is electrically coupled to the driving TFT.

The organic light-emitting display apparatus may further include a light-emitting control TFT configured to turn on by a light-emitting control signal that is supplied by a light-emitting control line, wherein the light-emitting control TFT is configured to deliver a driving voltage from the driving TFT to the OLED and is located between the driving TFT and the OLED.

The organic light-emitting display apparatus may further include an operation control TFT configured to turn on by the light-emitting control signal, wherein the operation control TFT is configured to deliver a driving voltage to the driving TFT and is located between a driving voltage line and the driving TFT.

The organic light-emitting display apparatus may further include an initializing TFT configured to turn on according to a previous scan signal that is delivered through a previous scan line, wherein the initializing TFT is configured to deliver an initializing voltage to a driving gate electrode of the driving TFT and is located between an initializing voltage line and the driving TFT.

According to another aspect of an embodiment according to the present invention, there is provided a photo mask for manufacturing an organic light-emitting display apparatus, the photo mask including: a switching opening pattern corresponding to a switching semiconductor layer; and a driving opening pattern coupled to the switching opening pattern, the driving opening pattern corresponding to a driving semiconductor layer and including: a first opening pattern bending from a first direction to a second direction that intersects with the first direction; a second opening pattern bending from the second direction to the first direction; and a third opening pattern coupling the first opening pattern to the second opening pattern, the third opening pattern making an obtuse angle with each of the first opening pattern and the second opening pattern.

Each of the first opening pattern and the second opening pattern may include an outer corner that is chamfered.

Each of the first opening pattern and the second opening pattern may further include a corrected pattern having an inner corner facing the outer corner, the inner corner protruding toward the outer corner.

The driving opening pattern may have a substantially constant width from the first opening pattern to the third opening pattern.

A length of the first opening pattern or a length of the second opening pattern may be longer than a length of the third opening pattern.

The third opening pattern may include a linear portion.

The third opening pattern may include a plurality of curved portions.

BRIEF DESCRIPTION OF THE DRAWINGS

The above and other features and aspects of the present invention will become more apparent by describing in detail example embodiments thereof with reference to the attached drawings in which.

DETAILED DESCRIPTION

Figure 1:
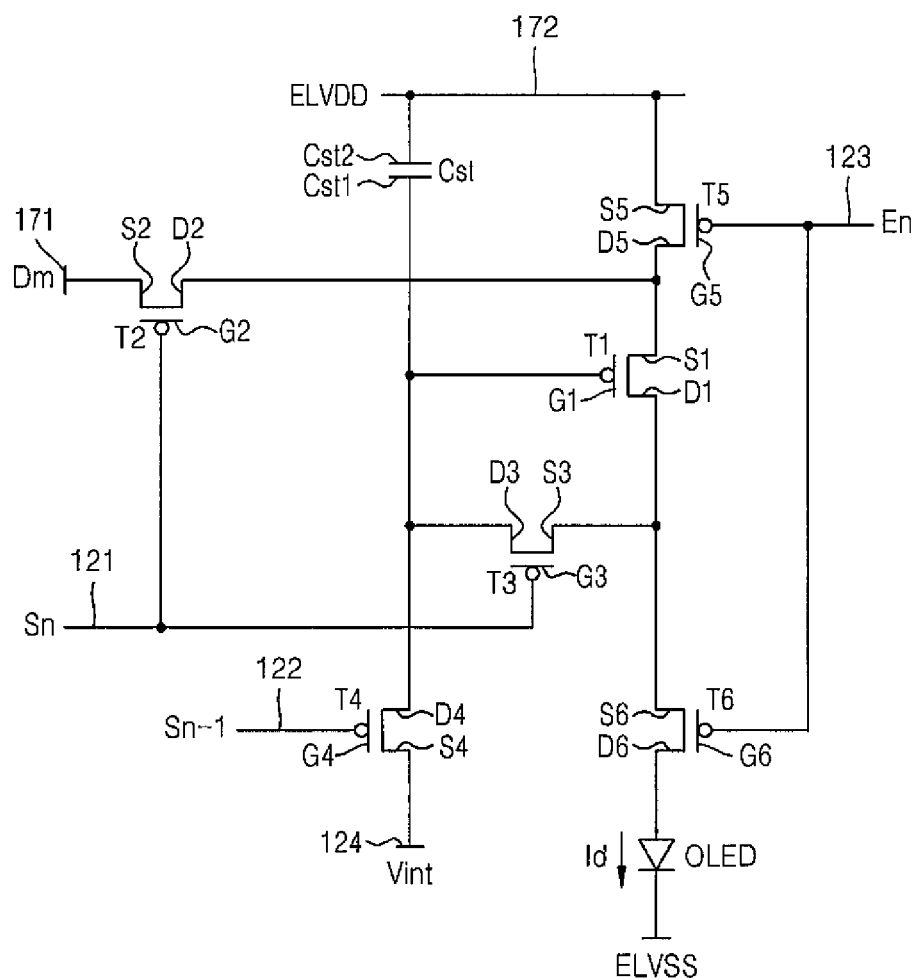
FIG. 1 is an equivalent circuit diagram of one pixel of an organic light-emitting display apparatus, according to an example embodiment of the present invention.

Expressions such as "at least one of," when preceding a list of elements, modify the entire list of elements and do not modify the individual elements of the list.

For the sake of simplicity and clarity of description, the present disclosure may not show or describe matters that are not relevant to the described embodiments of the present invention. In addition, the accompanying drawings may expand or exaggerate size, thickness, and width of shown features to more clearly express several layers and regions.

The same or similar components have the same reference numerals throughout the specification. The terms "first" and "second" are not used herein as limited meanings, but to distinguish a component from another component. In addition, when an element such as a film, region, or component is referred to as being "on" another element, it can be directly on the another element or intervening elements may also be present.

The embodiment will be described below in more detail with reference to example embodiments of the present invention that are shown in the accompanying drawings.

Figure 2:
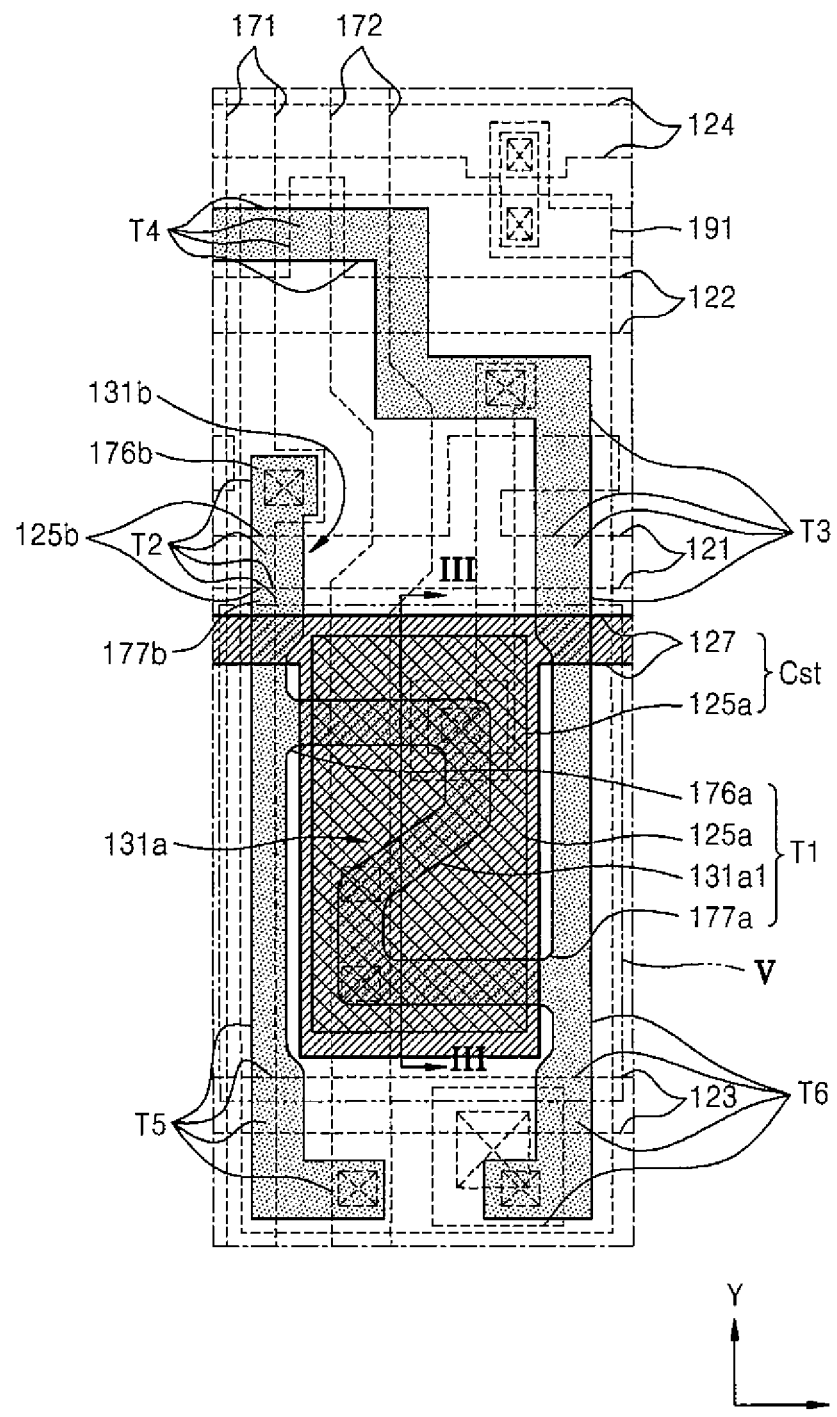
FIG. 2 is a detailed plan view of a pixel of the organic light-emitting display apparatus of FIG. 1, according to an example embodiment of the present invention.
Figure 3:
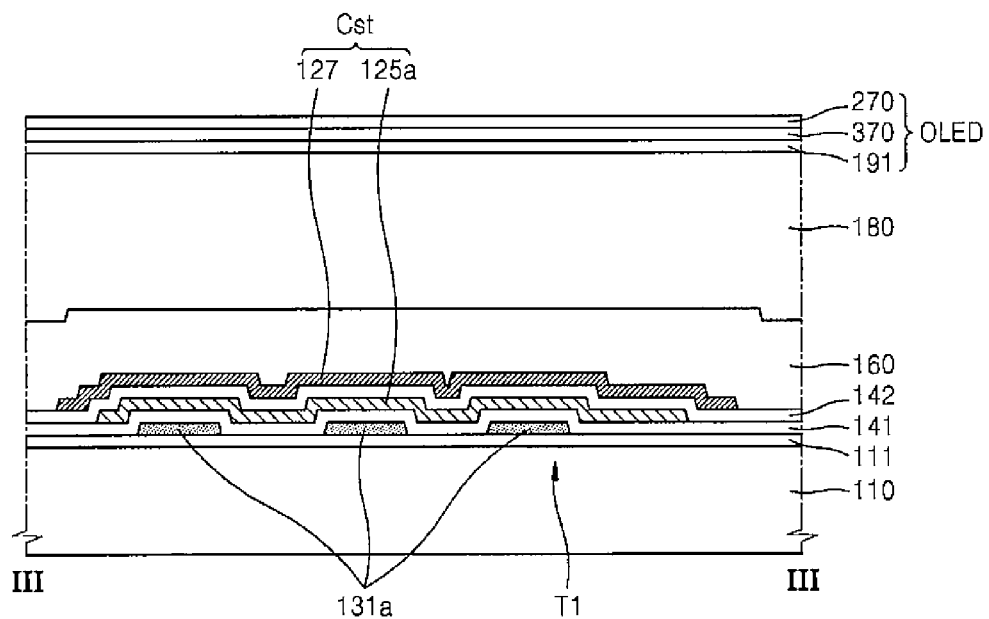
FIG. 3 is a cross-sectional view taken along the line III-III of the pixel of FIG. 2, according to an example embodiment of the present invention.
Figure 4:
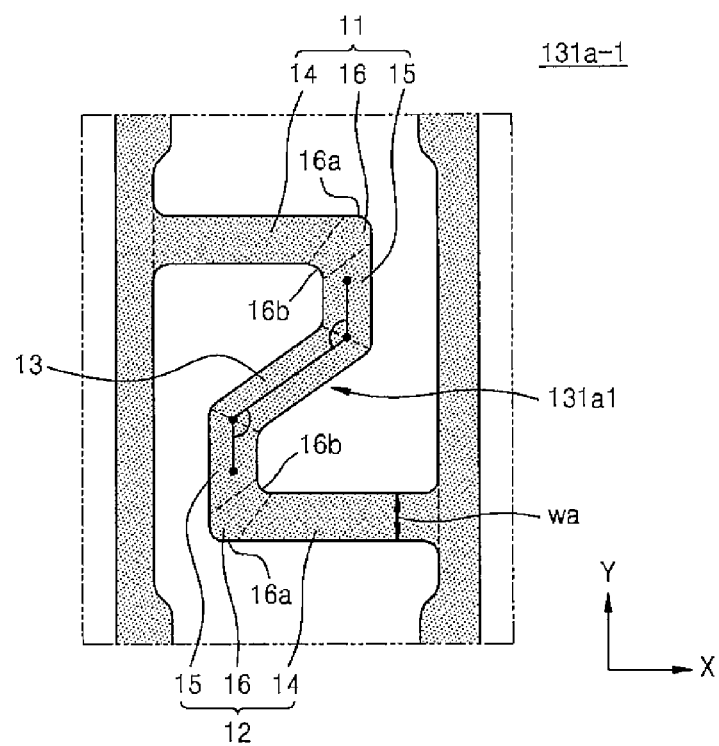
FIG. 4 is an internal plan view of box V of FIG. 2, according to an example embodiment of the present invention.

FIG. 1 is an equivalent circuit diagram of one pixel of an organic light-emitting display apparatus, according to an embodiment of the present invention. FIG. 2 is a detailed plan view of a pixel of the organic light-emitting display apparatus of FIG. 1, according to an embodiment of the present invention. FIG. 3 is a cross-sectional view taken along the line III-III of the pixel of FIG. 2, according to an embodiment of the present invention. FIG. 4 is an internal plan view of box V of FIG. 2, according to an embodiment of the present invention.

In one embodiment, the organic light-emitting display apparatus includes a display region that is on a substrate and displays images, and a surrounding region that surrounds the display region. A plurality of pixels that emit light and a plurality of wirings that apply an electrical signal to drive each pixel are arranged on the display region. For example, the wirings may include scan lines 121 and 122 that transmit scan signals Sn and Sn-1, a data line 171 that transmits a data signal, and a driving voltage line 172 that supplies (e.g., transmits) a driving voltage ELVDD. The embodiment is not limited thereto and may further include an initializing voltage line 124 that provides (e.g., transmits) an initializing voltage Vint and a light-emitting control line 123 that provides (e.g., transmits) a light-emitting control signal En, as shown in FIG. 1. Each pixel is arranged at a point where a plurality of wirings that extend in a first direction cross a plurality of wirings that extend in a second direction that crosses the first direction.

Each pixel includes an organic light-emitting diode (OLED) that emits light and a pixel circuit that receives a signal from a wiring and drives the OLED. Pixel circuit may include at least two TFTs and at least one capacitor. The embodiment is not limited thereto and the pixel circuit may, for example, include six TFTs and one capacitor, as shown in FIG. 1.

The organic light-emitting display apparatus, according to an embodiment of the present invention, will be described below with reference to FIGS. 1 to 4.

The six TFTs include a driving TFT T1, a switching TFT T2, a compensation TFT T3, an initializing TFT T4, an operation control TFT T5, and a light-emitting control TFT T6.

A gate G1 of the driving TFT T1 is electrically coupled to a terminal Cst1 of a storage capacitor Cst, a source S1 of the driving TFT T1 is electrically coupled to the driving voltage line 172 via the operation control TFT T5, and a drain D1 of the driving TFT T1 is electrically coupled to an anode of an OLED via the light-emitting control TFT T6. The driving TFT T1 receives a data signal Dm according to a switching operation of the switching TFT T2 and supplies a driving current Id to the OLED.

A gate G2 of the switching TFT T2 is electrically coupled to the scan line 121, a source S2 of the switching TFT T2 is electrically coupled to the data line 171, and a drain D2 of the switching TFT T2 is electrically coupled to the source S1 of the driving TFT T1 and to the driving voltage line 172 via the operation control TFT T5. The switching TFT T2 is turned on according to a scan signal Sn transmitted through the scan line 121 and performs a switching operation in which the data signal Dm transmitted to the data line 171 is transmitted to the source S1 of the driving TFT T1.

A gate G3 of the compensation TFT T3 is electrically coupled to the scan line 121, the source S3 of the compensation TFT T3 is electrically coupled to the drain D1 of the driving TFT T1 and to an anode of the OLED via the light-emitting control TFT T6, and a drain D3 of the compensation TFT T3 is electrically coupled to the terminal Cst1 of the storage capacitor Cst, a drain D4 of the initializing TFT T4, and the gate G1 of the driving TFT T1. When the compensation TFT T3 is turned on according to a scan signal Sn transmitted through the scan line 121, the compensation TFT T4 couples the gate G1 of the driving TFT T1 to the drain D1 thereof to diode couple (e.g., element-couple) the driving TFT T1, and thus compensates for a threshold voltage of the driving TFT T1.

The gate G4 of the initializing TFT T4 is electrically coupled to a previous scan line 122, a source S4 of the initializing TFT T4 is electrically coupled to the initializing voltage line 124, the drain D4 of the initializing TFT T4 is electrically coupled to the terminal Cst1 of the storage capacitor Cst, the drain D3 of the compensation TFT T3, and the gate G1 of the driving TFT T1. The initializing TFT T4 is turned on according to a previous scan signal Sn-1 transmitted through the previous scan line 122, and performs an initializing operation in which the initializing voltage Vint is transmitted to the gate G1 of the driving TFT T1 and a voltage of the gate G1 of the driving TFT T1 is initialized.

A gate G5 of the operation control TFT T5 is electrically coupled to the light-emitting control line 123, a source S5 of the operation control TFT T5 is electrically coupled to the driving voltage line 172, and a drain D5 of the operation control TFT T5 is electrically coupled to the source S1 of the driving TFT F1 and the drain D2 of the switching TFT T2. The operation control TFT T5 is coupled between the driving voltage line 172 and the driving TFT T1. The operation control TFT T5 is turned on by the light-emitting control signal En transmitted by the light-emitting control line 123 and transmits the driving voltage ELVDD to the driving TFT T1.

A gate G6 of the light-emitting control TFT T6 is electrically coupled to the light-emitting control line 123, a source S6 of the light-emitting control TFT T6 is electrically coupled to the drain D1 of the driving TFT T1 and the source S3 of the compensation TFT T3, and a drain D6 of the light-emitting control transistor T6 is electrically coupled to the anode of the OLED. The light-emitting control TFT T6 is between the driving TFT T1 and the OLED. The light-emitting control TFT T6 is turned on by the light-emitting control signal En transmitted by the light-emitting control line 123 and transmits the driving voltage ELVDD from the driving TFT T1 to the OLED.

The operation control TFT T5 and the light-emitting control TFT T6 are concurrently (e.g., simultaneously) turned on according to the light-emitting control signal En transmitted through the light-emitting control signal 123, the driving voltage ELVDD is transmitted to the OLED, and a driving current Id flows in the OLED.

The other terminal Cst2 of the storage capacitor Cst is electrically coupled to the driving voltage line 172, and a cathode of the OLED is electrically coupled to a common voltage ELVSS. Accordingly, the OLED receives the driving current Id from the driving TFT T1 and emits light to display an image.

A detailed operation of one pixel of an organic light-emitting display apparatus, according to an embodiment of the present invention, will be described below in detail.

First, a low-level previous scan signal Sn-1 is supplied through the previous scan line 122 during an initializing period. Then, the initializing TFT T4 is turned on in response to the low-level previous scan signal Sn-1, the initializing voltage Vint from the initializing voltage line 124 is electrically coupled to the gate G1 of the driving TFT T1 through the initializing TFT T4, and the driving TFT T1 is initialized by the initializing voltage Vint.

Subsequently, a low-level scan signal Sn is supplied through the scan line 121 during a data programming period. Then, the switching TFT T2 and the compensation TFT T3 are turned on in response to the low-level scan signal Sn.

As such, the driving TFT T1 is diode-coupled (e.g., element-coupled) by the turned-on compensation TFT T3 and is forward-biased.

Then, a compensation voltage Dm+Vth (where Vth is a negative value) that is obtained by subtracting the absolute value of the threshold voltage Vth of the driving TFT T1 from the data signal Dm supplied from the data line 171 is applied to the gate G1 of the driving TFT T1.

The driving voltage ELVDD and the compensation voltage Dm+Vth are applied to the terminals Cst1 and Cst2, respectively, of the storage capacitor Cst and electrical charges corresponding to the voltage difference across the storage capacitor Cst are stored in the storage capacitor Cst. Subsequently, the light-emitting control signal En supplied from the light-emitting control line 123 is changed from a high level to a low level during a light-emitting period. Then, the operation control TFT T5 and the light-emitting control TFT T6 are turned on by the low-level light-emitting control signal En during the light-emitting period.

Then, the driving current Id is generated, which corresponds to the voltage difference between a voltage of the gate G1 of the driving TFT T1 and the driving voltage ELVDD, and is supplied to the OLED through the light-emitting control TFT T6. During the light-emitting period, a gate-source voltage Vgs of the driving TFT T1 is maintained as (Dm+Vth)−ELVDD by the storage capacitor Cst, and according to the current-voltage relation of the driving TFT T1, the driving current Id is proportional to the square of a value that is obtained by subtracting the threshold voltage Vth from the gate-source voltage Vgs, that is, Id is proportional to (Dm−ELVDD)$^2$. Thus, the driving current Id is not affected by the threshold voltage Vth of the driving TFT T1.

A structure of the organic light-emitting display apparatus will be described below in detail in a stacked order with reference to FIGS. 2 to 4. In this case, the organic light-emitting display apparatus is described in terms of the structure of a TFT, in particular, the driving TFT T1 and the switching TFT T2. The structures of other TFTs are not described because they are similar to those of the driving TFT T1 and the switching TFT T2.

Referring to FIGS. 2 and 3, a buffer layer 111 is formed on a substrate 110, which is a dielectric substrate that may include glass, quartz, ceramic, plastic, and/or the like.

In one embodiment, semiconductor layers 131a and 131b are formed on the buffer layer 111. The semiconductor layers 131a and 131b are formed in various suitable curved shapes. The semiconductor layers 131a and 131b may be formed of polysilicon. The semiconductor layers 131a and 131b include a channel region between source and drain regions, wherein the channel region is not doped with an impurity and the source and drain regions are doped with impurities. In this embodiment, an impurity varies depending on a kind of TFT and may be an N-type impurity or a P-type impurity. The semiconductor layers 131a and 131b include a driving semiconductor layer 131a, which is formed in the driving TFT T1, and a switching semiconductor layer 131b, which is formed in the switching TFT T2, that are electrically coupled to each other.

The driving semiconductor layer 131a includes a driving channel region 131a1, and a driving source region 176a and a driving drain region 177a between which the driving channel region 131a1 exists and that face each other. The switching semiconductor layer 131b includes a switching source region 176b and a switching drain region 177b that face each other and between which a switching channel region exists.

Referring to FIG. 4, the driving channel region 131a1 includes a first region 11 that is bent from a first direction x and extends in a second direction y that intersects with the first direction x, a second region 12 that is bent from the second direction y and extends in the first direction x, and a third region 13 that couples the first region 11 to the second region 12. Accordingly, the driving channel region 131a1 may be arranged in a shape similar to a zigzag and include a curved portion.

Referring to FIGS. 2 and 3, a first dielectric layer 141 is arranged on the substrate 110 to cover the semiconductor layers 131a and 131b. The first dielectric layer 141 may be a multi-layer or single-layer thin film that includes an inorganic material and/or an organic material.

A driving gate electrode 125a is arranged on the first dielectric layer 141. The storage capacitor Cst is arranged to vertically face the driving gate electrode 125a.

The storage capacitor Cst includes a first storage condensing plate 125a and a second storage condensing plate 127 between which a second dielectric layer 142 is arranged. In this embodiment, the driving gate electrode 125a also functions as the first storage condensing plate 125a, the second gate dielectric layer 142 functions as an insulator, and a storage capacitance is determined by charges stored in the storage capacitor Cst and the voltage between both the first and second storage condensing plates 125a and 127.

The first storage condensing plate 125a is separated from a neighbouring pixel and formed in a quadrilateral shape. In addition, the first storage condensing plate 125a is at the same layer as, and formed of the same material as, the scan line 121, the previous scan line 122, the light-emitting control line 123, and the switching gate electrode 125b. The second storage condensing plate 127 is electrically coupled to a neighbouring pixel and formed of the same material as the initializing voltage line 124 and on the same layer as it.

As such, to secure sufficient space for the fabrication of the storage capacitor Cst, which is otherwise reduced by the driving semiconductor layer 131a with a curved portion, the storage capacitor Cst is formed on top of (e.g., formed to vertically face) the driving semiconductor layer 131a and thus it is possible to secure the storage capacitance even under the space constraints of high resolution devices.

According to an embodiment of the present invention, the driving semiconductor layer 131a, including a plurality of curved portions, is formed and thus it is possible to form the driving semiconductor layer 131a in a long shape in a narrow space. Thus, because it is possible to form the driving channel region 131a1 of the driving semiconductor layer 131a in a long shape, the driving range of the gate voltage applied to the driving gate electrode 125a is increased (e.g., widened).

Thus, because the driving range of the gate voltage is wide, it is possible to more finely control gradations of light emitted from the OLED by changing the amplitude of the gate voltage and as a result, it is possible to increase the resolution of the organic light-emitting display apparatus and enhance display quality.

The semiconductor layers 131a and 131b, including the driving semiconductor layer 131a, are formed by a photolithography process. In particular, a semiconductor layer for patterning is formed on the entire substrate and then a photoresist that is photosensitive is formed on the semiconductor layer. Next, a photo mask with a desired pattern is used to produce, in the photoresist, a pattern (e.g., a predetermined pattern) corresponding to that of the photo mask through light exposure. The semiconductor layer is then etched using a remaining photoresist pattern as a mask and patterns of the driving semiconductor layer 131a and the switching semiconductor layer 131b are thus formed.

In the case of a pattern with a complex shape including a curved portion such as the driving semiconductor layer 131a, it may be difficult to obtain a desired pattern due to a number of reasons, such as, the reflow of the photoresist, an error in an amount of light exposure, and an etching error, in the photolithography process. Therefore, such a structure has a limitation in that it is difficult to uniformly obtain an end product due to process variations (e.g., process dispersion) that occurs in the photolithography process.

As the organic light-emitting display apparatus increase in resolution, the width of a pixel is narrowed and thus, the shape of the driving semiconductor layer 131a is also changed to have a narrow width. In this regard, descriptions will be made with reference to a pattern of a driving channel layer according to a comparative example of the embodiment of FIG. 12. When a virtual axis of a third region 3 is perpendicular to those of a first region 1 and a second region 2, like the comparative example shown in FIG. 12, the following limitations exist: when the driving channel region has a "⊇" shape (e.g., an S shape) like the comparative example shown in FIG. 12, the width of the driving semiconductor layer 131a becomes non-uniform (e.g., narrower at one region that at other regions) and the length of the third region 3 becomes very short, thus, a definition of a channel width near the third region 3 becomes unclear. For example, the channel widths of corners where the third region 3 is electrically coupled to the first region 1 and the second region 2 are wider than a predicted width (e.g., an expected width) due to the reflow of photoresist, an error in an amount of light exposure, an etching error, etc., but the channel width at the third region 3 that is a linear portion may be realized to be relatively narrow. Thus, it is difficult to realize a uniform channel width over the entire length of the driving channel region in such a structure.

To solve such limitations, that is, to increase (e.g., maximize) the length of a channel, reduce (e.g., minimize) an error due to process variations (e.g., process dispersion), and keep the channel width substantially constant (e.g., constant), an embodiment of the present invention provides the following driving channel region structure and a photo mask for realizing the same:

Referring to FIGS. 2 and 4, the driving channel region 131a1, according to an embodiment of the present invention, includes the first region 11 that is bent from the first direction x and extends in the second direction y that intersects with the first direction x, the second region 12 that is bent from the second direction y and extends in the first direction x, and the third region 13 that couples the first region 11 to the second region 12, as described above.

One end of the first region 11 is electrically coupled to the driving source region 176a and the other end of the first region 11 is electrically coupled to one end of the third region 13. The first region 11 includes a fourth region 14 that extends in the first direction x, a fifth region 15 that extends in the second direction y, and a sixth region 16 that couples the fourth region 14 to the fifth region 15 and has a curvature. For example, the sixth region 16 is arranged between the fourth region 14 and the fifth region 15, which are arranged almost perpendicular to each other. The sixth region 16 is formed to have a smooth curved surface to have a curvature. Because the driving channel region 131a1 has a channel width (e.g., a predetermined channel width) wa, the sixth region 16 includes an outer corner 16a and an inner corner 16b that faces the outer corner 16a. Thus, both the outer corner 16a and the inner corner 16b are formed as a curved line having a curvature.

One end of the second region 12 is electrically coupled to one end of the third region 13 and the other end of the second region 12 is electrically coupled to the driving drain region 177a. As in the first region 11, the second region 12 includes a fourth region 14 that extends in the first direction x, a fifth region 15 that extends in the second direction y, and a sixth region 16 that couples the fourth region 14 to the fifth region 15 and has a curvature. For example, the sixth region 16 is arranged between the fourth region 14 and the fifth region 15, which are arranged almost perpendicular to each other. The second region 12 has a shape that is obtained by rotating the first region 11 180 degrees clockwise. The sixth region 16 is formed to have a smooth curved surface to have a curvature. Because the driving channel region 131a1 has a channel width (e.g., a predetermined channel width) wa, the sixth region 16 includes an outer corner 16a and an inner corner 16b that faces the outer corner 16a. Thus, both the outer corner 16a and the inner corner 16b are formed as a curved line having a curvature.

The other end of the first region 11 is electrically coupled to one end of the second region 12 by the third region 13. The central axis of the first region 11 is arranged in parallel with the central axis of the second region 12. In particular, the central axis of the fifth region 15 of the first region 11 is arranged in parallel with the central axis of the fifth region 15 of the second region 12.

The third region 13 is configured to make an obtuse angle with the first region 11 and to also make an obtuse angle with the second region 12. The third region 13 may include a linear portion, and the central axis of the third region 13 makes an obtuse angle with the central axis of the first region 11 (e.g., with the central axis of the fifth region 15 of the first region 11). In addition, the central axis of the third region 13 also makes an obtuse angle with the central axis of the second region 12 (e.g., with the central axis of the fifth region 15 of the second region 12). Thus, the third region 13 is arranged to be diagonal to the first direction x and the second direction y and couples the first region 11 to the second region 12.

When the third region 13 is configured to make an obtuse angle with the first region 11 and the second region 12 as in an embodiment of the present invention, it is possible to reduce process error and process variations (e.g., to decrease process dispersion and error) at the third region 13 without a significant decrease in channel length and it is possible to realize a substantially constant (e.g., a constant) channel width wa over the entire length of the channel region.

The length of the first region 11 or the second region 12 is longer than that of the third region 13. Because the first region 11 and the second region 12 include bent portions, they may have a relatively longer channel length (e.g., make up a relatively longer portion of the channel length) in a limited space than the third region 13 that includes only a linear portion.

Figure 5:
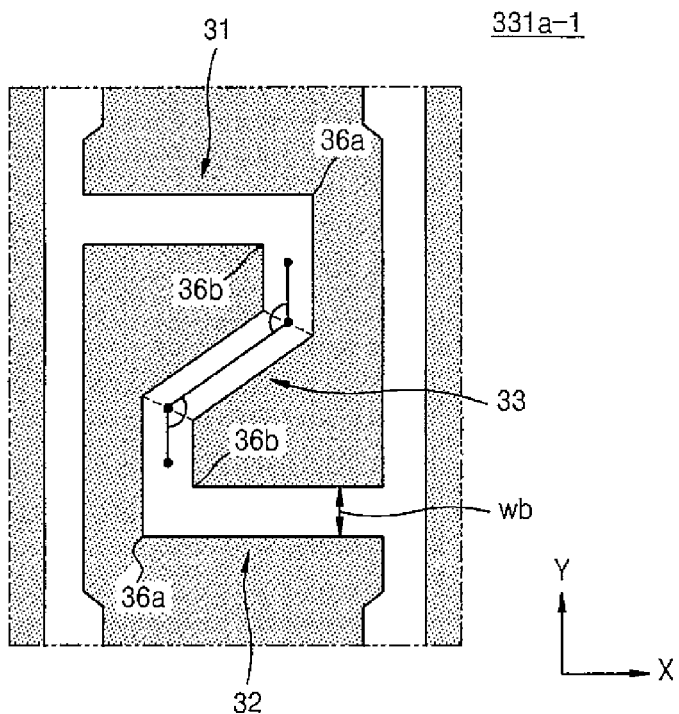
FIG. 5 is a plan view of a photo mask for manufacturing the organic light-emitting display apparatus of FIG. 4, according to an example embodiment of the present invention.

FIG. 5 is a plan view of a photo mask 331-1a for realizing the driving semiconductor layer 131a-1 of FIG. 4, according to an embodiment of the present invention. The photo mask 331a-1 includes a switching opening pattern that corresponds to the switching semiconductor layer 131b, and a driving opening pattern that is coupled to the switching opening pattern and corresponds to the driving semiconductor layer 131a-1. FIG. 5 primarily shows the driving opening pattern for convenience of description.

Referring to FIG. 5, the photo mask 331a-1 corresponds to the driving semiconductor layer 131a-1 of FIG. 4 and also includes a first opening pattern 31 that is bent from the first direction x and extends in the second direction y intersecting with the first direction x, a second opening pattern 32 that is bent from the second direction y and extends in the first direction x, and a third opening pattern 33 that couples the first opening pattern 31 to the second opening pattern 32 and is configured to make an obtuse angle with each of the portions of the first opening pattern 31 and the second opening pattern 32 that extend in the second direction y.

The length of the first opening pattern 31 or the second opening pattern 32 may be longer than that of the third opening pattern 33. Because the first opening pattern 31 and the second opening pattern 32 include bent portions, they may have a relatively longer channel length (e.g., make up a relatively longer portion of the channel length) in a limited space than the third opening pattern 33 that includes only a linear portion.

In addition, in the case of the photo mask 331a-1, the first to third opening patterns 31 to 33 have a substantially constant (e.g., a constant) width wb to pattern to form the driving semiconductor layer 131a-1 with a substantially constant (e.g., constant) channel width wa.

In an embodiment of FIG. 4, the channel width wa corresponding to the sixth region 16 may be realized to be a little wider than channel widths wa of other regions. To overcome this limitation, FIGS. 6 and 7 respectively show a driving semiconductor layer 131a-2 where a channel width wa in FIG. 4 of the sixth region 16 is corrected, and a photo mask 331a-2 where an outer corner 36a of the first opening pattern 31 is corrected. In addition, FIGS. 8 and 9 respectively show the driving semiconductor layer 131a-3 where the channel width at the sixth region 16 is corrected, and the photo mask 331a-3 where an inner corner 36b of the first opening pattern 31 is corrected.

Figure 6:
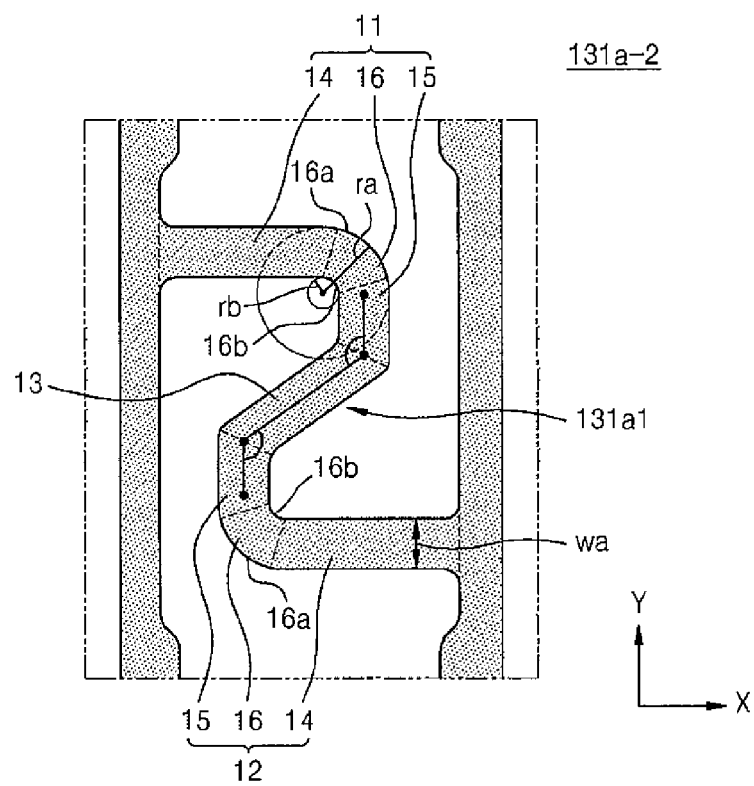
FIG. 6 is a plan view of a driving semiconductor layer of an organic light-emitting display apparatus, according to another embodiment of the present invention.
Figure 7:
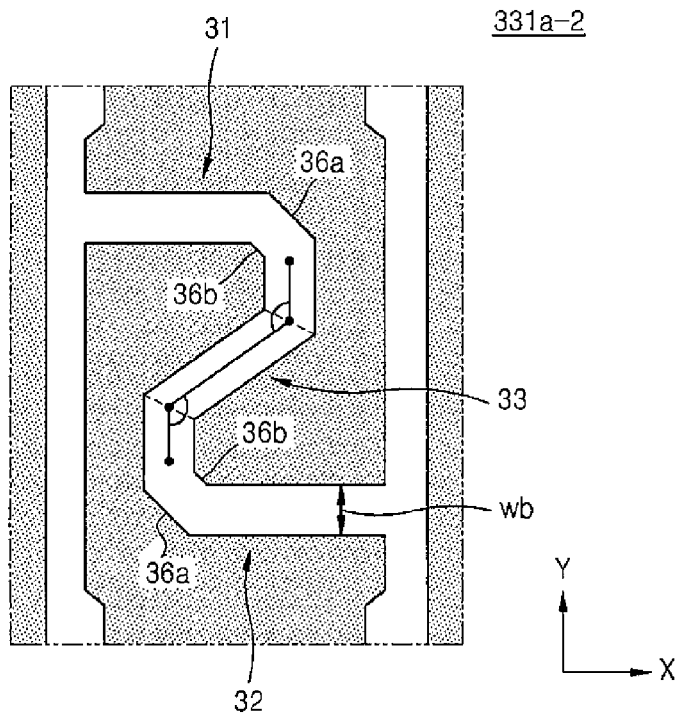
FIG. 7 is a plan view of a photo mask for manufacturing a pattern of FIG. 6, according to an example embodiment of the present invention.

FIG. 6 is a plan view of a driving semiconductor layer 131a-2 of an organic light-emitting display apparatus, according to another embodiment of the present invention. FIG. 7 is a plan view of a photo mask 331a-2 for manufacturing a pattern of FIG. 6, according to an embodiment of the present invention.

Referring to FIG. 6, a driving channel region 131a1, according to another embodiment, includes a first region 11 that is bent from the first direction x and extends in the second direction y intersecting with the first direction x, a second region 12 that is bent from the second direction y and extends in the first direction x, and a third region 13 that couples the first region 11 to the second region 12 and makes an obtuse angle with each of the portions of the first region 11 and the second region 12 that extend in the second direction y, as in the embodiment of FIG. 4. In addition, each of the first region 11 and the second region 12 includes a fourth region 14 that extends in the first direction x, a fifth region 15 that extends in the second direction y, and a sixth region 16 that couples the fourth region 14 to the fifth region 15 and has a curvature.

In this case, the sixth region 16 includes an outer corner 16a and an inner corner 16b that faces the outer corner, and a radius of curvature of the outer corner 16a is greater than that of the inner corner 16b. The radius of curvature is the degree of curvature of a curved surface or a curved line and as the radius of curvature increases, the curvature is less. Thus, the degree of curvature of the outer corner 16a is less than that of the inner corner 16b. This is different from the embodiment of FIG. 4. When comparing the radius of curvature of the outer corner 16a of the embodiment of FIG. 4 with the radius of curvature of the outer corner 16a of the embodiment of FIG. 6, it may be seen that the outer corner 16a of the embodiment of FIG. 6 has a smaller radius of curvature.

Because the level of curvature of the outer corner 16a of the sixth region 16 of this embodiment is relatively less than, for example, that of the corresponding outer corner of FIG. 4, it is possible to reduce process error and process variations (e.g., to decrease process dispersion and error) at the sixth region 16, and it is possible to realize a substantially constant (e.g., a constant) channel width wa over the entire driving channel region 131a1. Further, it is possible to solve the limitation that the channel width at the outer corner 16a is wider than a predicted width (e.g., an expected width) due to the reflow of photoresist, an error in an amount of light exposure, an etching error, etc. at the outer corner 16a of the sixth region 16 and it is possible to realize a substantially constant (e.g., constant) channel width wa over the entire length of the driving channel region 131a1.

FIG. 7 shows a photo mask 331a-2 for realizing a driving semiconductor layer 131a-2 of FIG. 6, according to an embodiment of the present invention. FIG. 7 also primarily shows a driving opening pattern for convenience of description as in the previous embodiment.

Referring to FIG. 7, the photo mask 331a-2 also corresponds to the driving semiconductor layer 131a-2 of FIG. 6 and includes a first opening pattern 31 that is bent from the first direction x and extended in the second direction y intersecting with the first direction x, a second opening pattern 32 that is bent from the second direction y and extends in the first direction x, and a third opening pattern 33 that couples the first opening pattern 31 to the second opening pattern 32 and is configured to make an obtuse angle with each of the portions of the first opening pattern 31 and the second opening pattern 32 that extend in the second direction y.

In addition, an outer corner 36a that each of the first opening pattern 31 and the second opening pattern 32 of the photo mask 331a-2 of FIG. 7 includes is chamfered. The chamfering indicates cutting (e.g., diagonally cutting) edges or corners to change them to slopes or round shapes. For example, by chamfering the outer corners 36a of the first opening pattern 31 and the second opening pattern 32, it is possible to increase the radius of curvature of the outer corner 16a of the sixth region 16 of FIG. 6.

Figure 8:
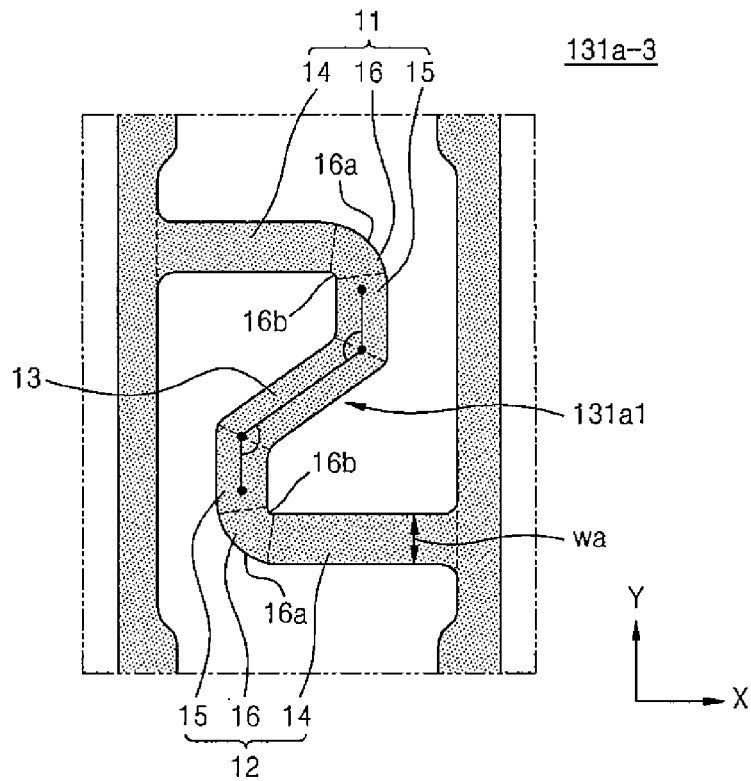
FIG. 8 is a plan view of a driving semiconductor layer of an organic light-emitting display apparatus, according to another embodiment of the present invention.
Figure 9:
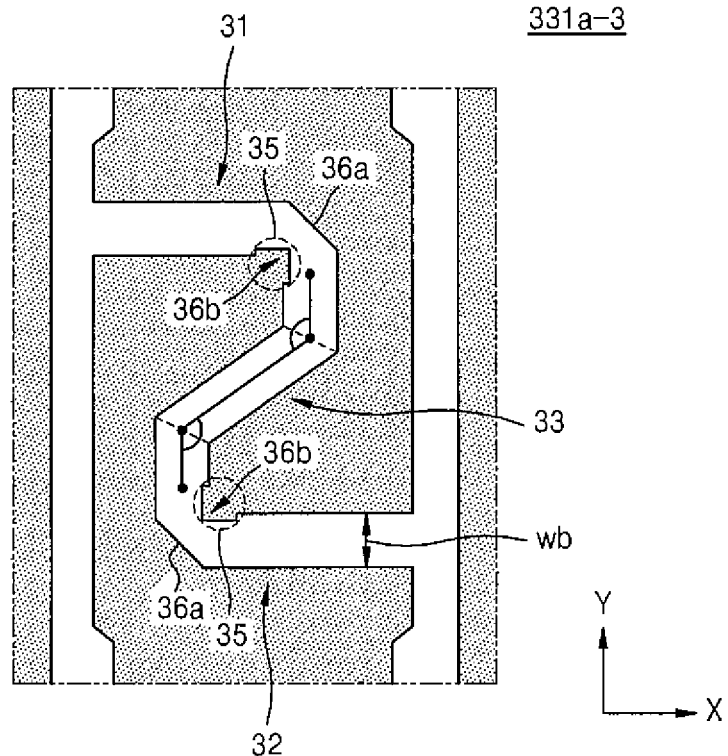
FIG. 9 is a plan view of a photo mask for manufacturing a pattern of FIG. 8, according to an example embodiment of the present invention.

FIG. 8 is a plan view of a driving semiconductor layer 131a-3 of an organic light-emitting display apparatus, according to another embodiment of the present invention. FIG. 9 is a plan view of a photo mask 331a-3 for manufacturing a pattern of FIG. 8, according to an embodiment of the present invention.

Referring to FIG. 8, a driving channel region 131a1, according to another embodiment of the present invention, includes a first region 11 that is bent from the first direction x and extends in the second direction y intersecting with the first direction x, a second region 12 that is bent from the second direction y and extends in the first direction x, and a third region 13 that couples the first region 11 to the second region 12 and makes an obtuse angle with each of the portions of the first region 11 and the second region 12 that extend in the second direction y, as in the embodiment of FIG. 6. In addition, each of the first region 11 and the second region 12 includes a fourth region 14 that extends in the first direction x, a fifth region 15 that extends in the second direction y, and a sixth region 16 that couples the fourth region 14 to the fifth region 15 and has a curvature. In addition, the radius of curvature of an outer corner 16a of the sixth region 16 is greater than that of an inner corner 16b.

In addition, according to the embodiment of FIG. 8, the radius of curvature of the inner corner 16b of the sixth region 16 is less than that of the inner corner of the sixth region 16 of the embodiment of FIG. 6. Thus, the degree of curvature of the inner corner 16b of the sixth region 16 of the embodiment of FIG. 8 is greater than that of the inner corner 16b of the sixth region 16 of the embodiment of FIG. 6.

When the degree of curvature of the inner corner 16b of the sixth region 16 increases as in the embodiment of FIG. 8, it is possible to reduce process error and process variations (e.g., to decrease process dispersion and error) at the sixth region 16 and it is possible to realize a substantially constant (e.g., a constant) channel width over the entire length of the driving channel region 131a1. Further, it is possible to solve the limitation that a channel width of a corner is wider than a predicted width (e.g., an expected width) as the boundary of the inner corner 16b becomes unclear due to the reflow of photoresist, an error in an amount of light exposure, an etching error, etc. at the inner corner 16b of the sixth region 16, and it is possible to realize a substantially constant (e.g., a constant) channel width wa over the entire length of the driving channel region 131a1.

FIG. 9 is a plan view of a photo mask 331a-3 for realizing the driving semiconductor layer 131a-3 of FIG. 8, according to an embodiment of the present invention. FIG. 9 also primarily shows a driving opening pattern for convenience of description as in the previous embodiments.

Referring to FIG. 9, the photo mask 331a-3 also corresponds to the driving semiconductor layer 131a-3 of FIG. 8 and includes a first opening pattern 31 that is bent from the first direction x and extends in the second direction y intersecting with the first direction x, a second opening pattern 32 that is bent from the second direction y and extends in the first direction x, and a third opening pattern 33 that couples the first opening pattern 31 to the second opening pattern 32 and is configured to make an obtuse angle with each of the portions of the first opening pattern 31 and the second opening pattern 32 that extend in the second direction y. The outer corner 36a that each of the first opening pattern 31 and the second opening pattern 32 includes is chamfered.

In addition, the photo mask 331a-3, according to the embodiment of FIG. 9, each of the first opening pattern 31 and the second opening pattern 32 includes a corrected pattern 35, such that the inner corner 36b facing the outer corner 36a protrudes toward the outer corner 36a. Because the corrected pattern 35 that protrudes toward the outer corner 36a is added to the inner corner 36b of the photo mask 331a-3, it is possible to regulate the degree of curvature of the inner corner 36b of a pattern that is formed by the photo mask 331a-3.

Figure 10:
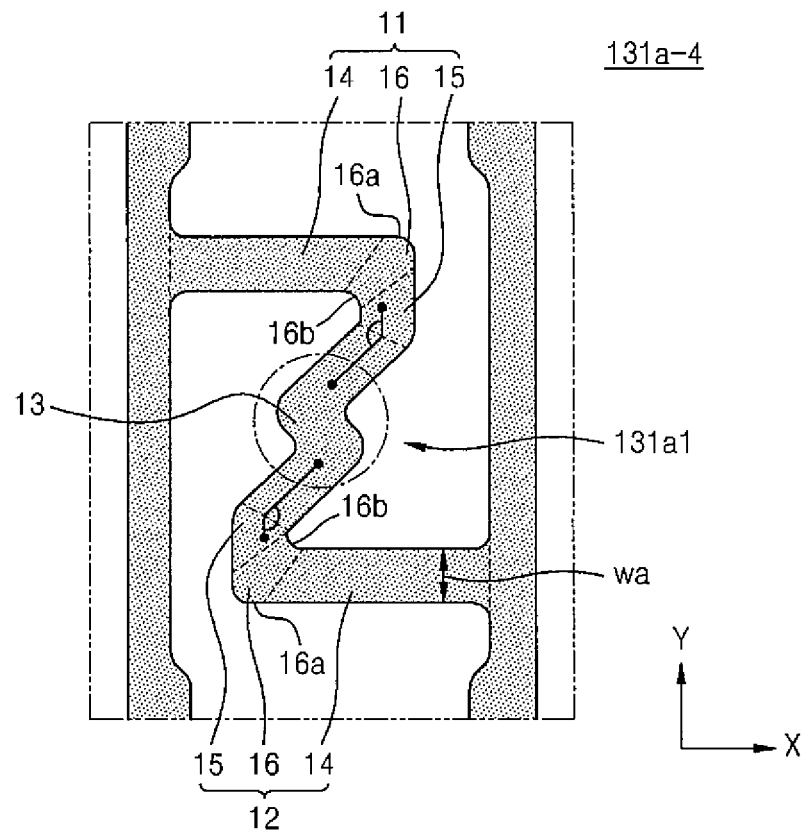
FIG. 10 is a plan view of a driving semiconductor layer of an organic light-emitting display apparatus, according to another embodiment of the present invention.
Figure 11:
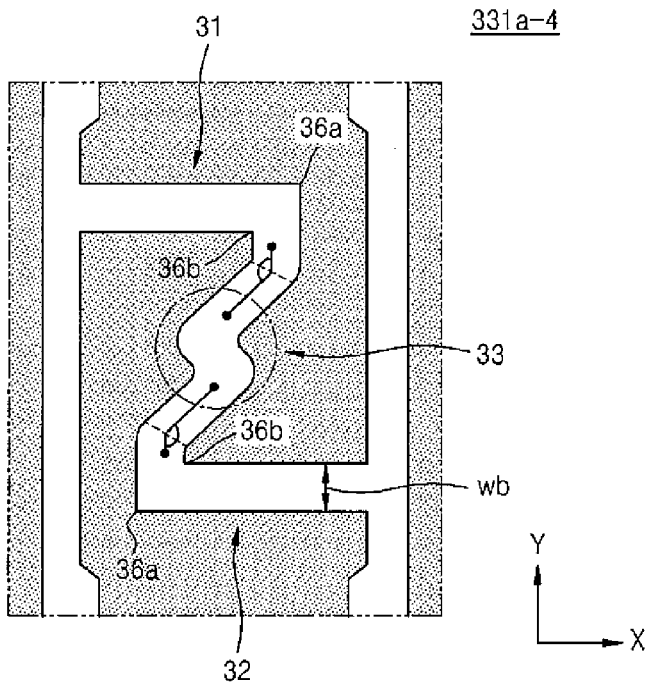
FIG. 11 is a plan view of a photo mask for manufacturing a pattern of FIG. 10, according to an example embodiment of the present invention.

FIG. 10 is a plan view of a driving semiconductor layer 131a-4 of an organic light-emitting display apparatus, according to another embodiment of the present invention. FIG. 11 is a plan view of a photo mask 331a-4 for manufacturing a pattern of FIG. 10, according to an embodiment of the present invention.

Referring to FIG. 10, a driving channel region 131a1 according to a another embodiment includes a first region 11 that is bent from the first direction x and extends in the second direction y intersecting with the first direction x, a second region 12 that is bent from the second direction y and extends in the portions of the first direction x, and a third region 13 that couples the first region 11 to the second region 12 and makes an obtuse angle with each of the portions of the first region 11 and the second region 12 that extend in the second direction y, as in the embodiment of FIG. 4. In addition, each of the first region 11 and the second region 12 includes a fourth region 14 that extends in the first direction x, a fifth region 15 that extends in the second direction y, and a sixth region 16 that couples the fourth region 14 to the fifth region 15 and has a curvature.

Furthermore, according to the embodiment of FIG. 10, in order for the driving channel region 131a1 to realize a relatively longer channel length, the third region 13 further includes a plurality of curved portions as shown, and not only a linear portion.

Figure 12:
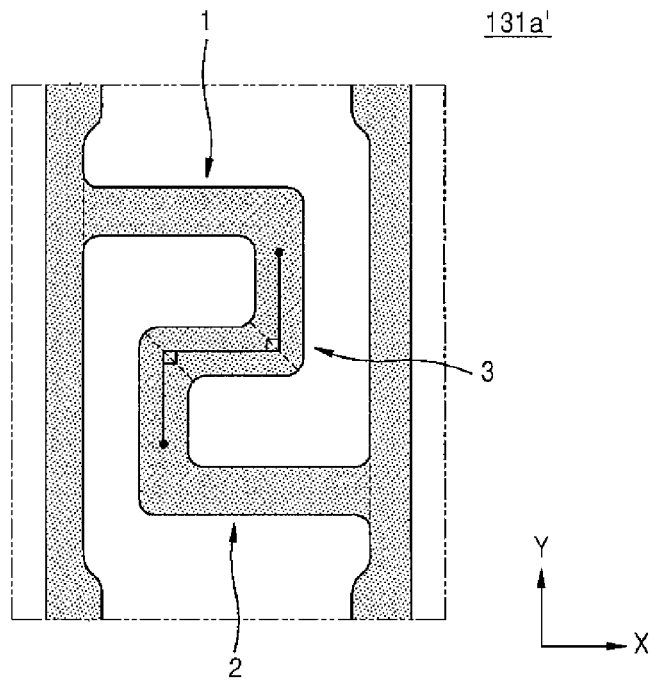
FIG. 12 is a plan view of a pattern of a driving channel region, according to a comparative example of embodiments according to the present invention.

FIG. 12 is a plan view of a pattern of a driving channel region, according to a comparative example used to explain embodiments according to the present invention.

Referring to FIG. 12, the driving channel region of a driving semiconductor layer 131a', according to the comparative example, has a design in which the vertical axis of a third region 3 is perpendicular to those of the first region 1 and the second region 2. That is, because the driving channel region has a "ㄹ" shape (e.g., an S shape), the width of the driving semiconductor layer 131a' becomes non-uniform (e.g., narrower at one region that at other regions) and the length of the third region 3 becomes very short, thus, a definition of the channel width at the driving channel region near the third region 3 may become unclear. For example, the channel width of a corner may be wider than a predicted width (e.g., an expected width) due to the reflow of photoresist, an error in an amount of light exposure, an etching error, etc. at the corners where the third region 3 is electrically coupled to the first region 1 and the second region 2 but the channel width at the third region 3 that is a linear portion may thus be realized to be relatively narrow. Thus, it is difficult to realize a uniform channel width over the entire length of the driving channel region in such a structure.

According to the above-described embodiments of FIGS. 4 through 9, it is possible to realize a substantially constant (e.g., constant) channel width over the entire length of the driving channel region 131a1 without a loss in a length of the driving channel region 131a1 due to the arrangement of the third region 13, the correction of the outer corner 16a, and the correction of the inner corner 16b. In addition, according to the embodiment of FIGS. 10 and 11, it is possible to increase (e.g., maximize) a length of the driving channel of the driving channel region 131a1 by adding the curved portions to the third region 13.

While the present invention has been described through the above example embodiments, one of ordinary skill in the art will understand that the embodiments are not limited thereto and various suitable modifications and variations may be made within the concept and scope of the present invention, as defined by the following claims and equivalents thereof.

What is claimed is:

1. An organic light-emitting display apparatus comprising:
   a switching thin film transistor (TFT) on a substrate, wherein the switching TFT is electrically coupled to a scan line and a data line;
   a driving TFT electrically coupled to the switching TFT, the driving TFT comprising a driving semiconductor layer; and
   an organic light-emitting diode (OLED) electrically coupled to the driving TFT,
   wherein the driving semiconductor layer comprises:
      a first region comprising a first curved region bending from a first direction to a second direction that intersects with the first direction;
      a second region comprising a second curved region bending from the second direction to the first direction; and
      a third region coupling the first region to the second region, the third region making an obtuse angle with each of the first region and the second region,
      wherein the first and second curved regions each comprise an inner corner and an outer corner opposite the inner corner across a respective one of the first and second curved regions, wherein a radius of curvature of the outer corner is greater than a radius of curvature of the inner corner.

2. The organic light-emitting display apparatus of claim 1, wherein the driving semiconductor layer has a constant width from the first region to the third region.

3. The organic light-emitting display apparatus of claim 1, wherein a length of the first region or a length of the second region is longer than a length of the third region.

4. The organic light-emitting display apparatus of claim 1, wherein the third region comprises a linear portion.

5. The organic light-emitting display apparatus of claim 1, wherein the third region comprises a plurality of curved portions.

6. The organic light-emitting display apparatus of claim 1, further comprising:
   a first dielectric layer on the substrate to cover the driving semiconductor layer; and
   a capacitor on the first dielectric layer, wherein the capacitor vertically faces the driving semiconductor layer.

7. The organic light-emitting display apparatus of claim 6, wherein the capacitor further comprises:
   a first capacitor electrode on the first dielectric layer, wherein the first capacitor electrode vertically faces the driving semiconductor layer and functions as a driving gate electrode;
   a second dielectric layer covering the first capacitor electrode; and
   a second capacitor electrode on the second dielectric layer, wherein the second capacitor electrode vertically faces the first capacitor electrode.

8. The organic light-emitting display apparatus of claim 1, further comprising a compensation TFT configured to compensate a threshold voltage of the driving TFT, wherein the compensation TFT is electrically coupled to the driving TFT.

9. The organic light-emitting display apparatus of claim 1, further comprising a light-emitting control TFT configured to turn on by a light-emitting control signal that is supplied by a light-emitting control line, wherein the light-emitting control TFT is configured to deliver a driving voltage from the driving TFT to the OLED and is located between the driving TFT and the OLED.

10. The organic light-emitting display apparatus of claim 9, further comprising an operation control TFT configured to turn on by the light-emitting control signal that is delivered by the light-emitting control line, wherein the operation control TFT is configured to deliver a driving voltage to the driving TFT and is located between a driving voltage line and the driving TFT.

11. The organic light-emitting display apparatus of claim 10, further comprising an initializing TFT configured to turn on according to a previous scan signal that is delivered through a previous scan line, wherein the initializing TFT is configured to deliver an initializing voltage to a driving gate electrode of the driving TFT and is located between an initializing voltage line and the driving TFT.

* * * * *